United States Patent [19]
Lin et al.

[11] Patent Number: 5,589,082
[45] Date of Patent: Dec. 31, 1996

[54] MICROELECTROMECHANICAL SIGNAL PROCESSOR FABRICATION

[75] Inventors: Liwei Lin; Clark T. Nguyen, both of Berkeley; Roger T. Howe, Lafayette; Albert P. Pisano, Berkeley, all of Calif.

[73] Assignee: The Regents of the University of California, Oakland, Calif.

[21] Appl. No.: 480,467

[22] Filed: Jun. 7, 1995

Related U.S. Application Data

[62] Division of Ser. No. 298,233, Aug. 30, 1994, Pat. No. 5,537,083, which is a continuation of Ser. No. 990,582, Dec. 11, 1992, abandoned.

[51] Int. Cl.$^6$ .................................................. H01L 21/00
[52] U.S. Cl. ..................... 216/2; 216/11; 216/33; 216/67; 156/650.1; 156/657.1
[58] Field of Search ...................... 216/2, 11, 13, 216/20, 33, 41, 67; 156/643.1, 650.1, 651.1, 657.1, 659.11, 662.1; 333/186

[56] References Cited

U.S. PATENT DOCUMENTS

| | | | |
|---|---|---|---|
| 4,918,032 | 4/1990 | Jain et al. | 437/228 |
| 4,997,521 | 3/1991 | Howe et al. | 156/657.1 X |

*Primary Examiner*—William Powell
*Attorney, Agent, or Firm*—Fish & Richardson, P.C.

[57] ABSTRACT

A micromechanical filter having planar components, and manufacturable using very large scale integrated circuit microfabrication techniques. The input and output transducers are interdigitated comb electrodes. The mechanical coupling between the input and output transducers includes planar flexures, displacement of the electrodes producing bending of the elements of the flexures. By sealing micromechanical filters in a vacuum and providing on-board circuitry, high signal-to-noise ratios and quality factors are achievable. Construction of a real-time spectrum analyzer using many micromechanical resonators, provides a device with high accuracy and a short sample time.

8 Claims, 17 Drawing Sheets

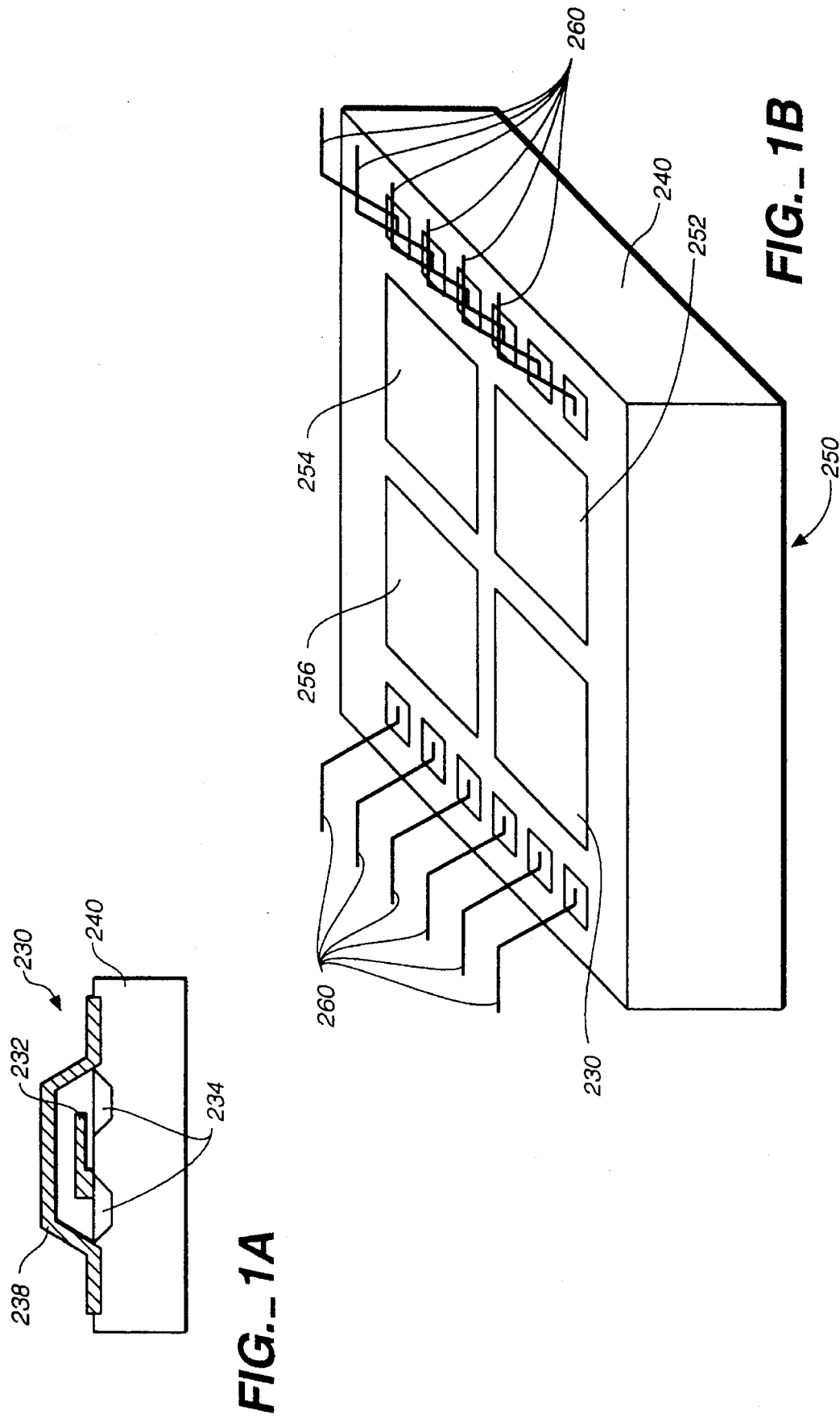

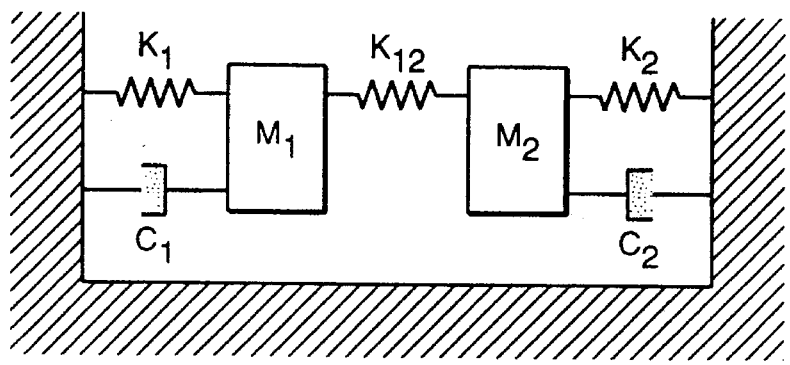
FIG._2A
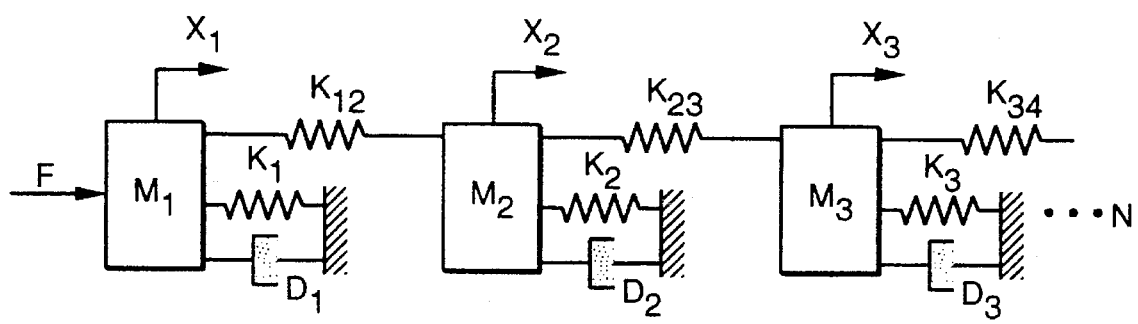
FIG._2B

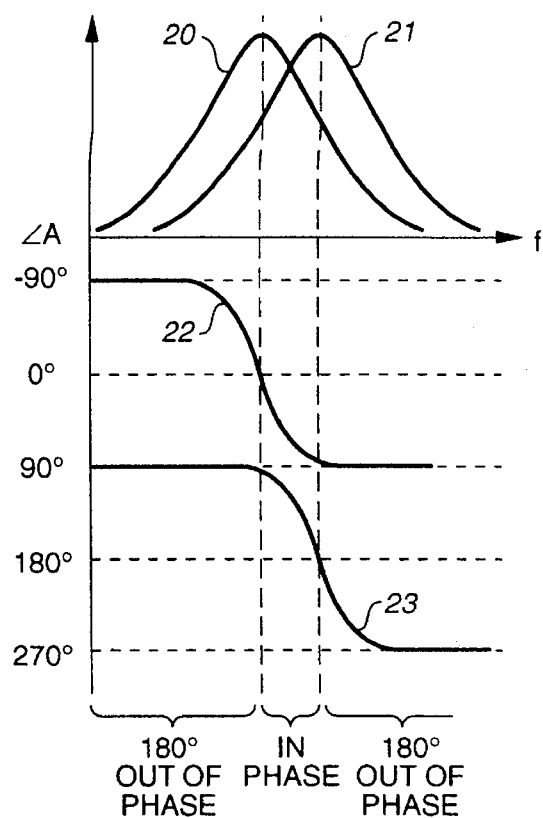
FIG._3A
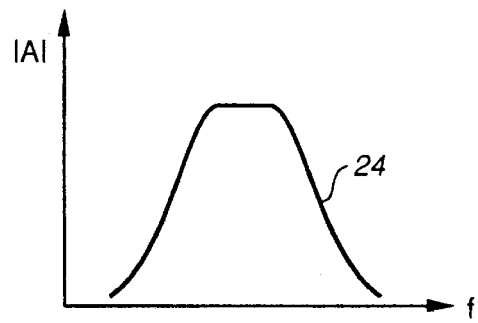
FIG._3B
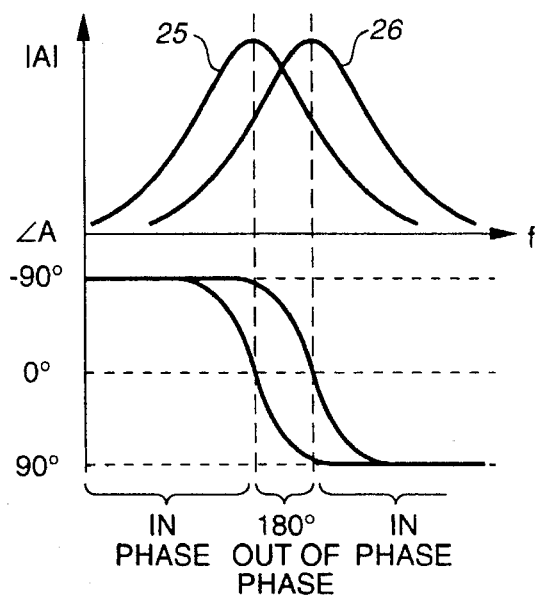
FIG._3C
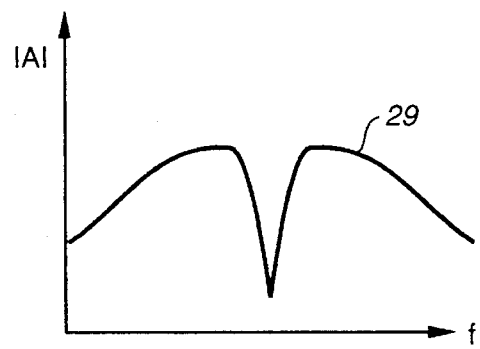
FIG._3D

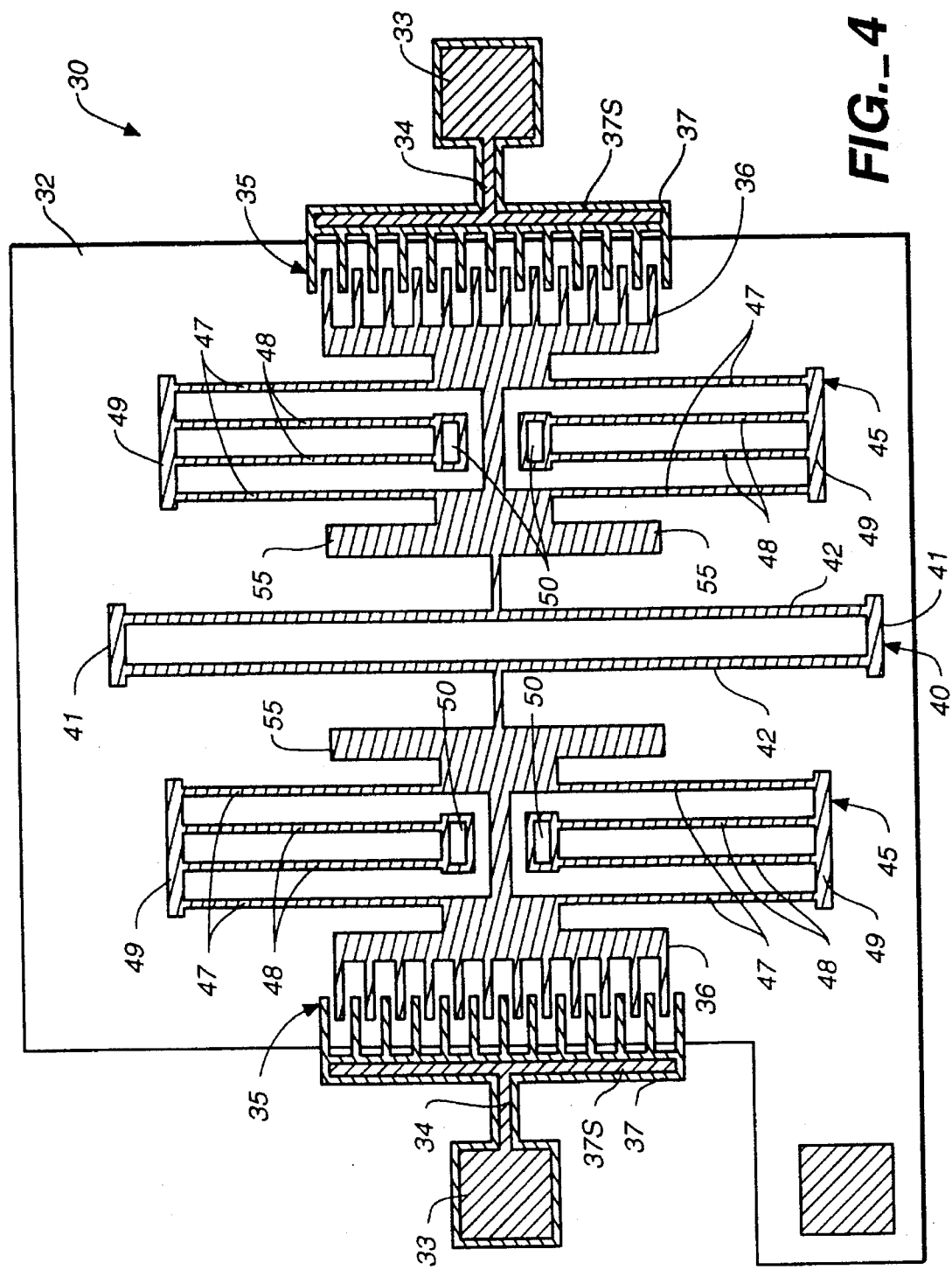
FIG._4

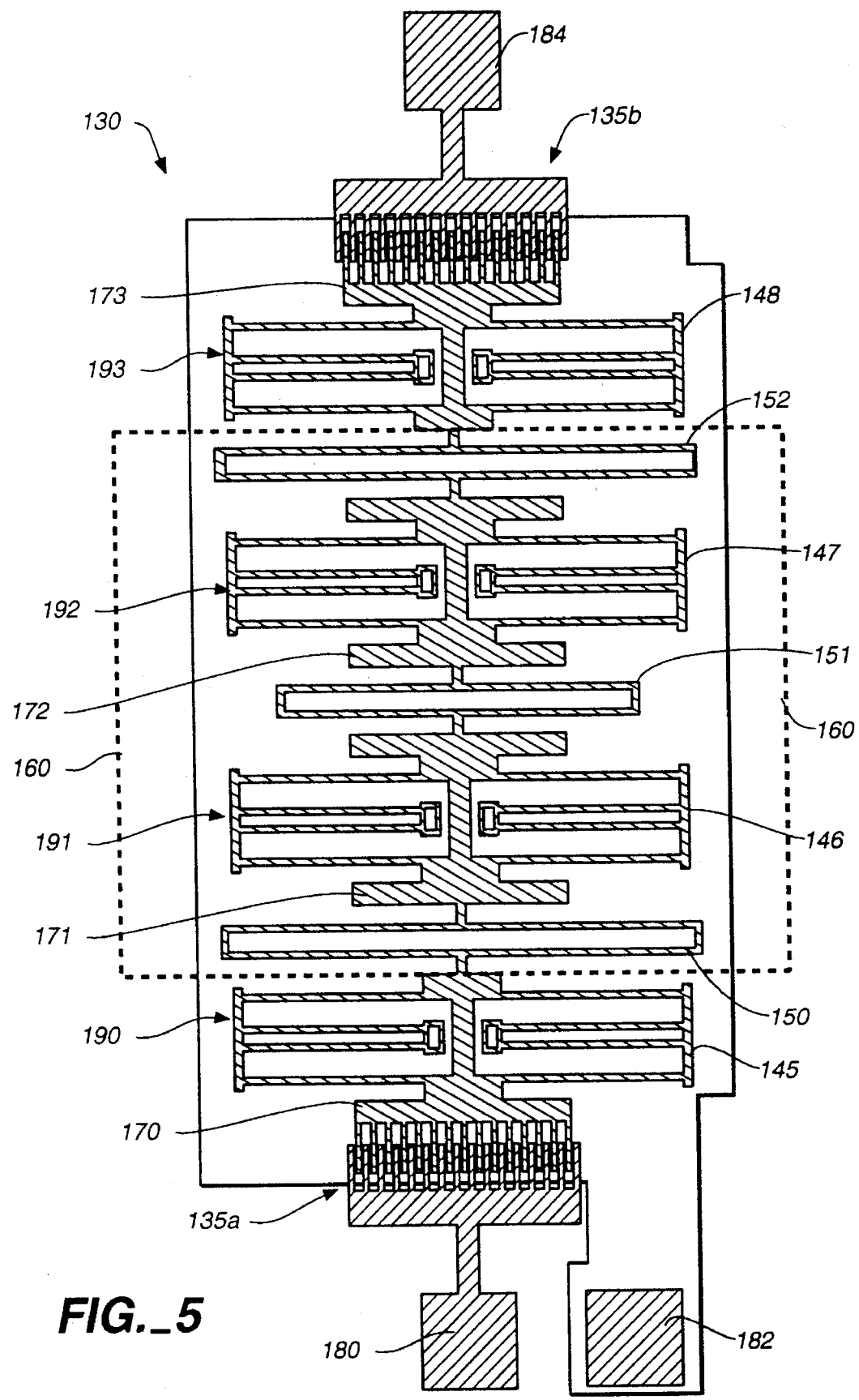
FIG._5

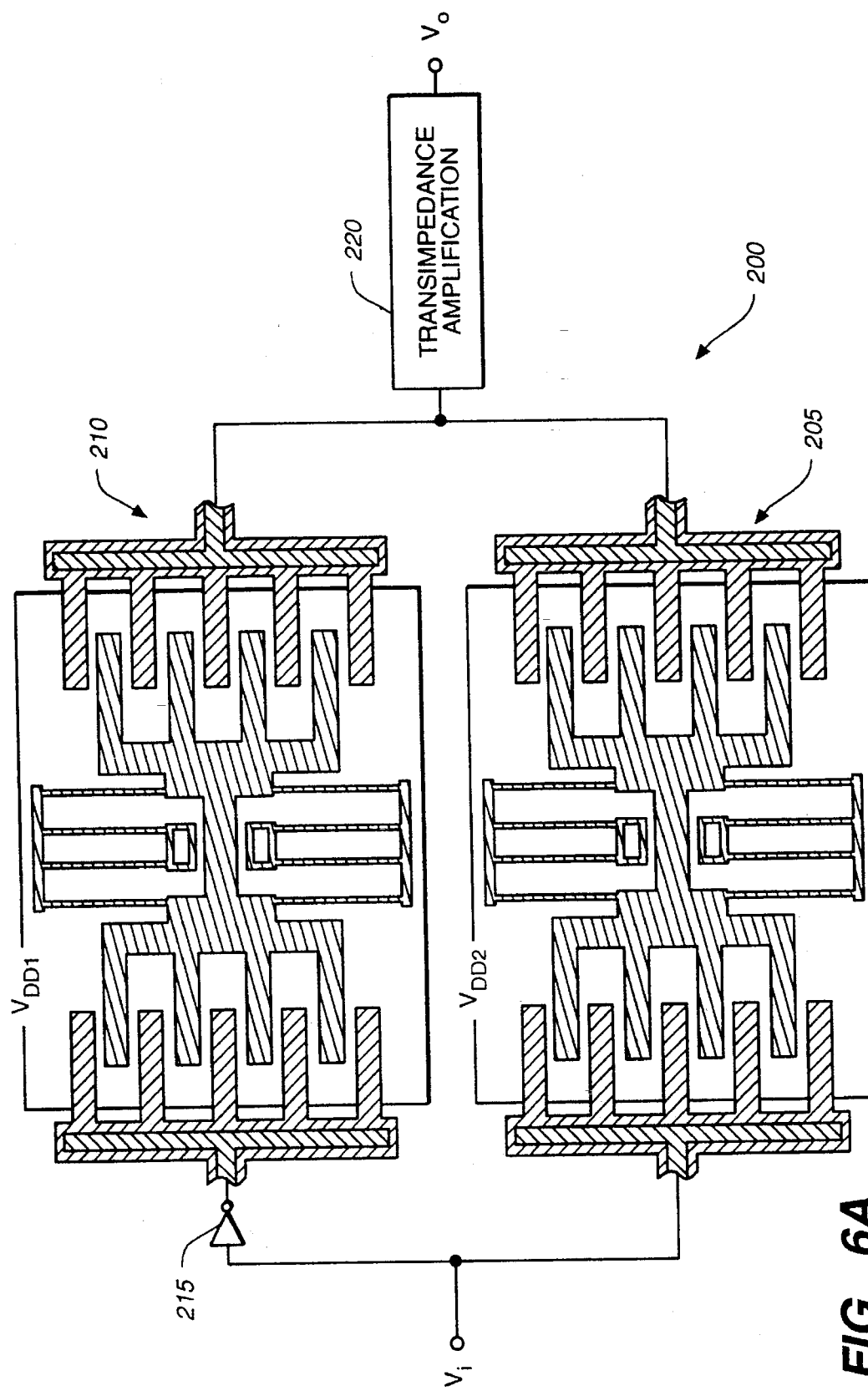
FIG._6A

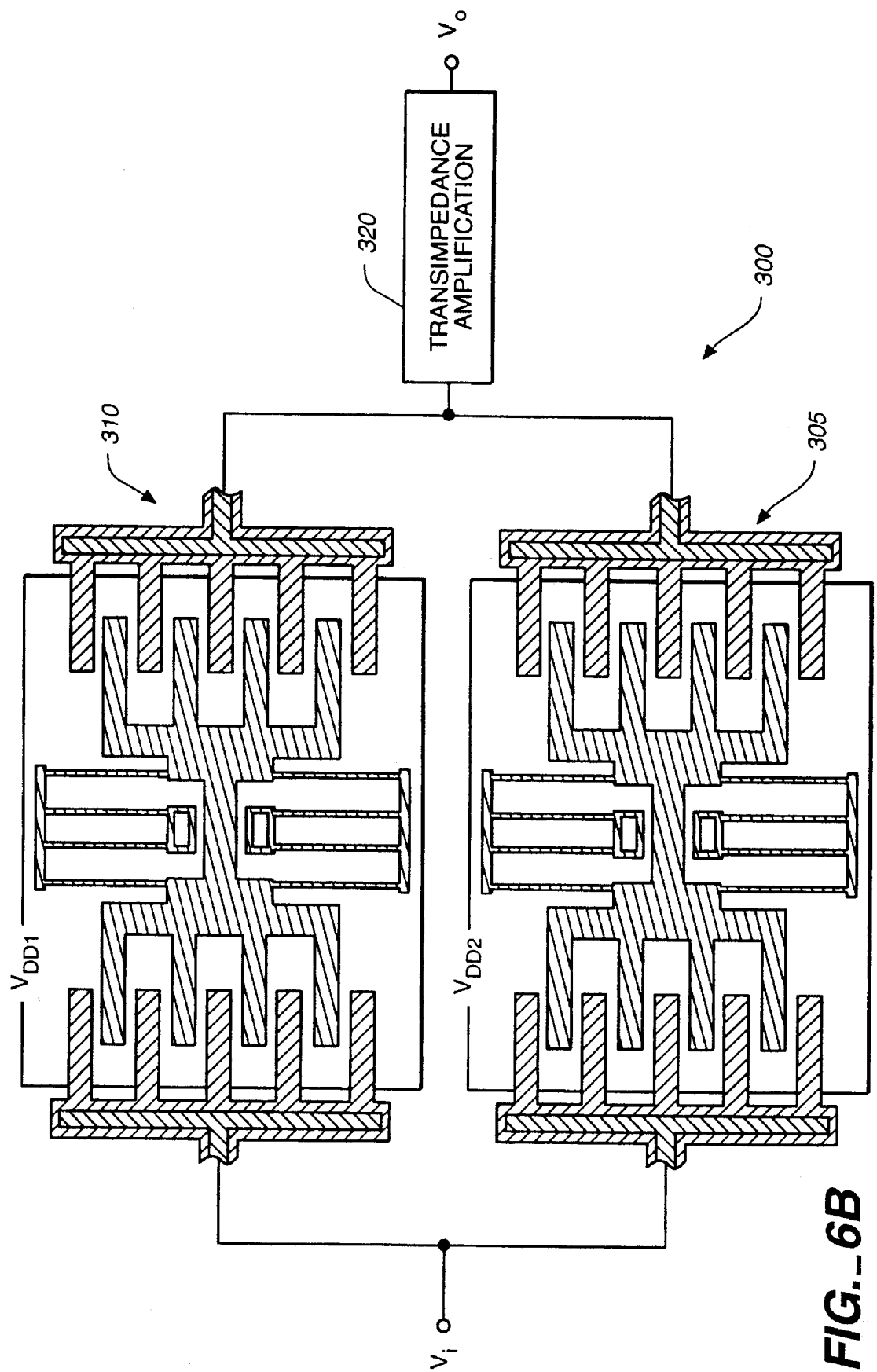
FIG._6B

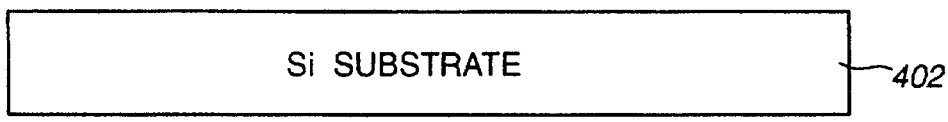
FIG._7A
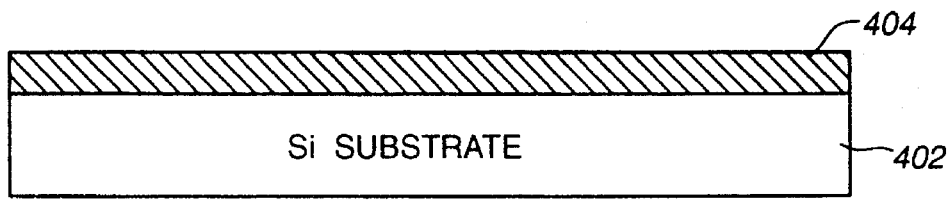
FIG._7B
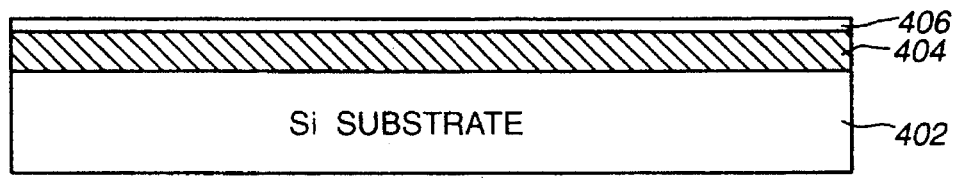
FIG._7C
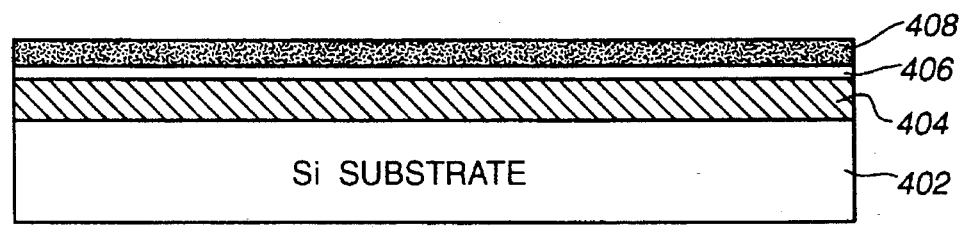
FIG._7D
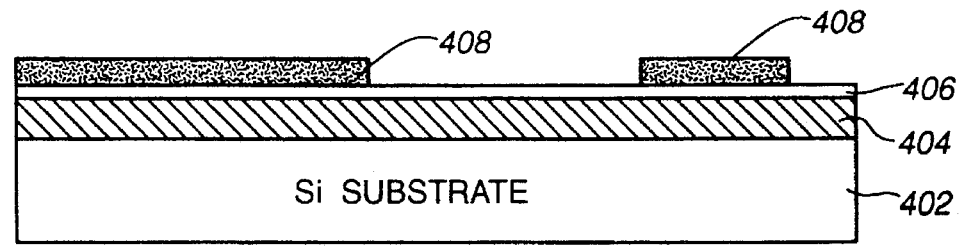
FIG._7E

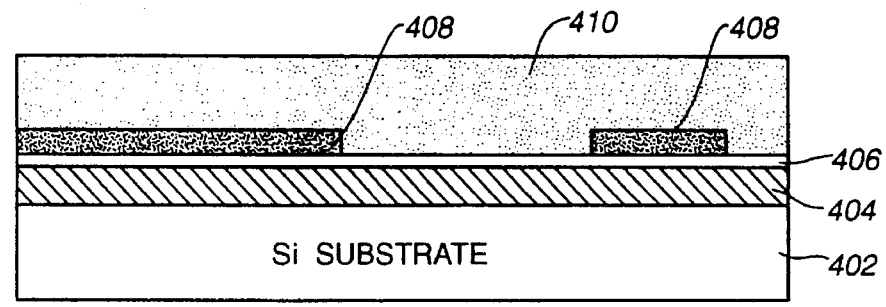
FIG._7F
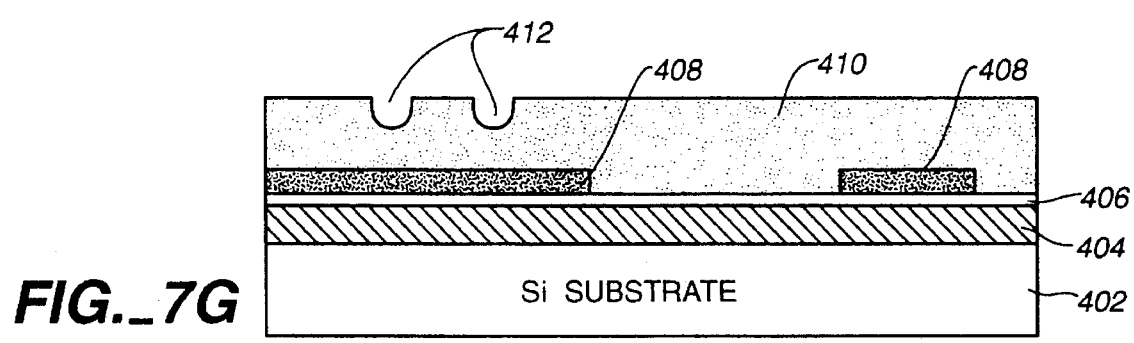
FIG._7G
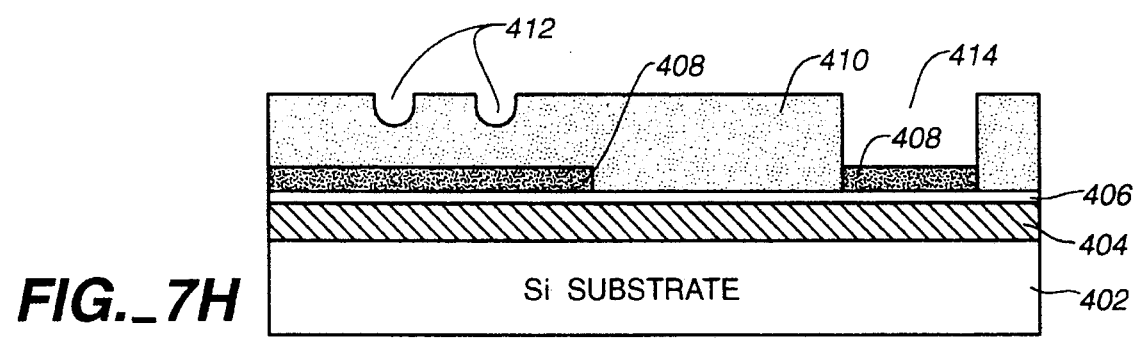
FIG._7H
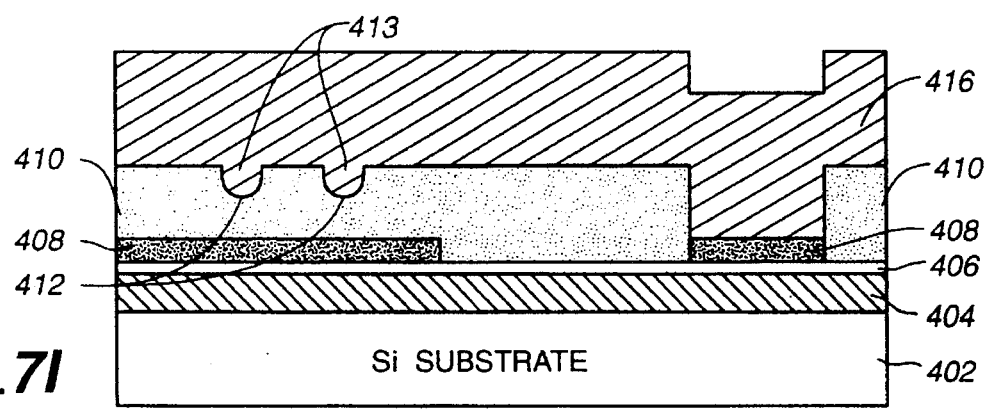
FIG._7I

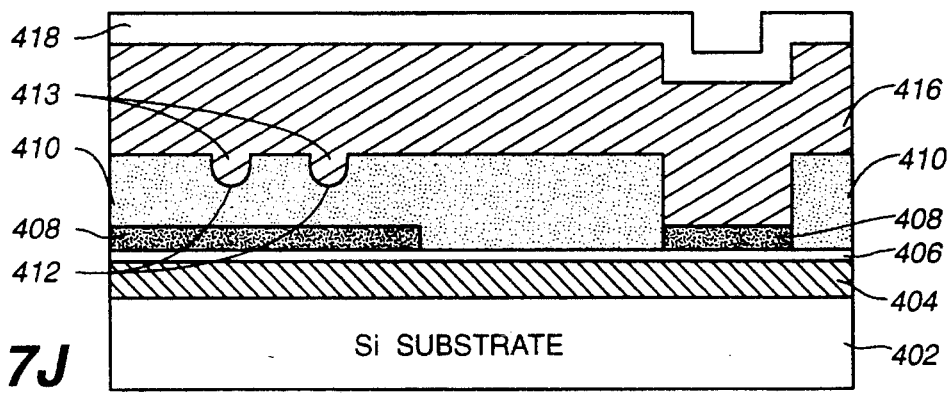
FIG._7J
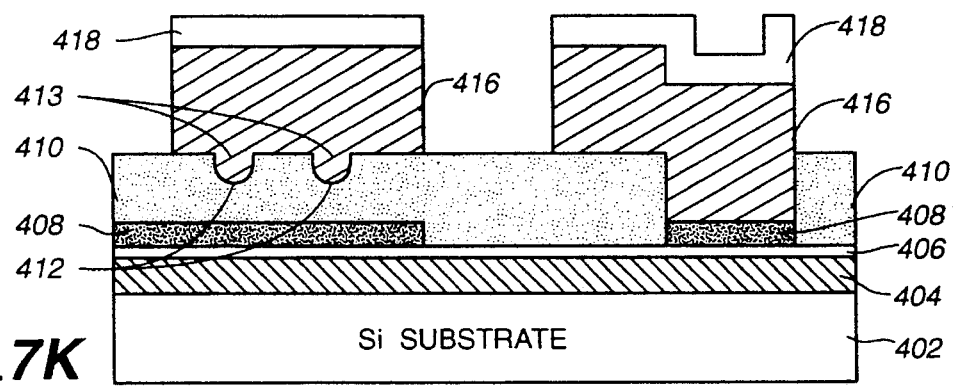
FIG._7K
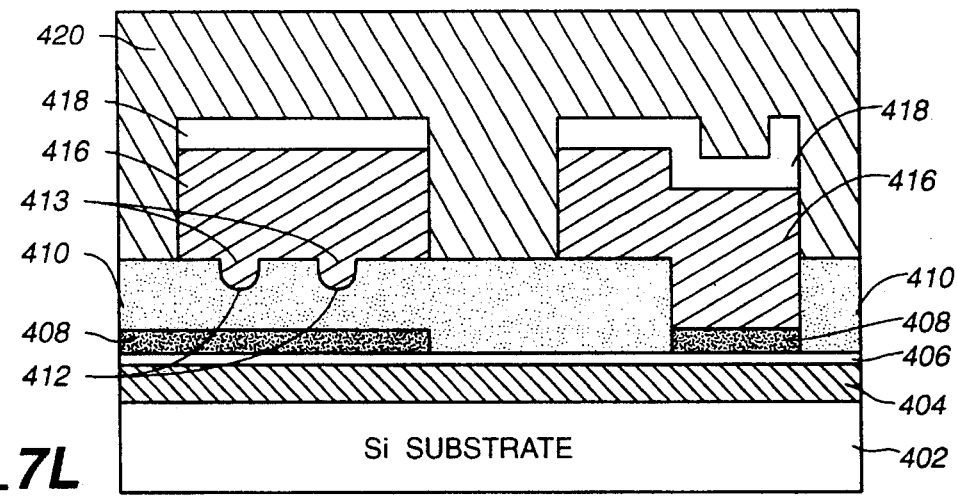
FIG._7L

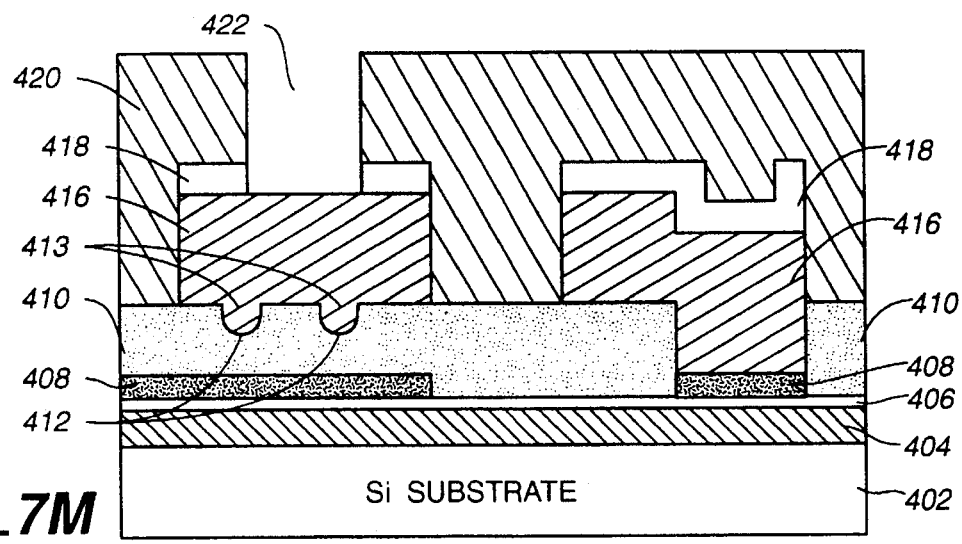
FIG._7M
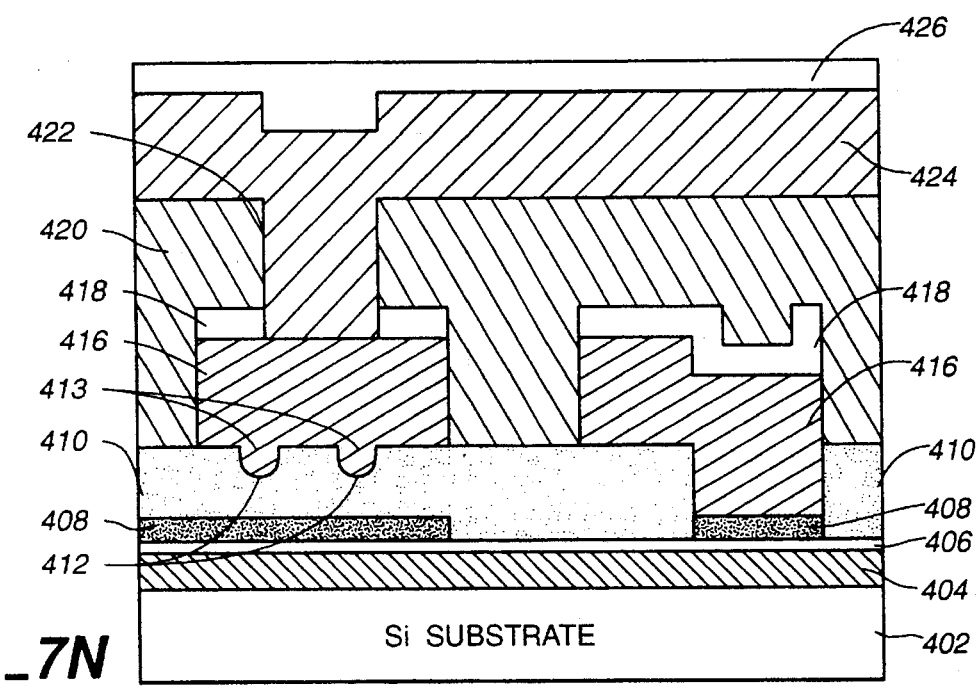
FIG._7N

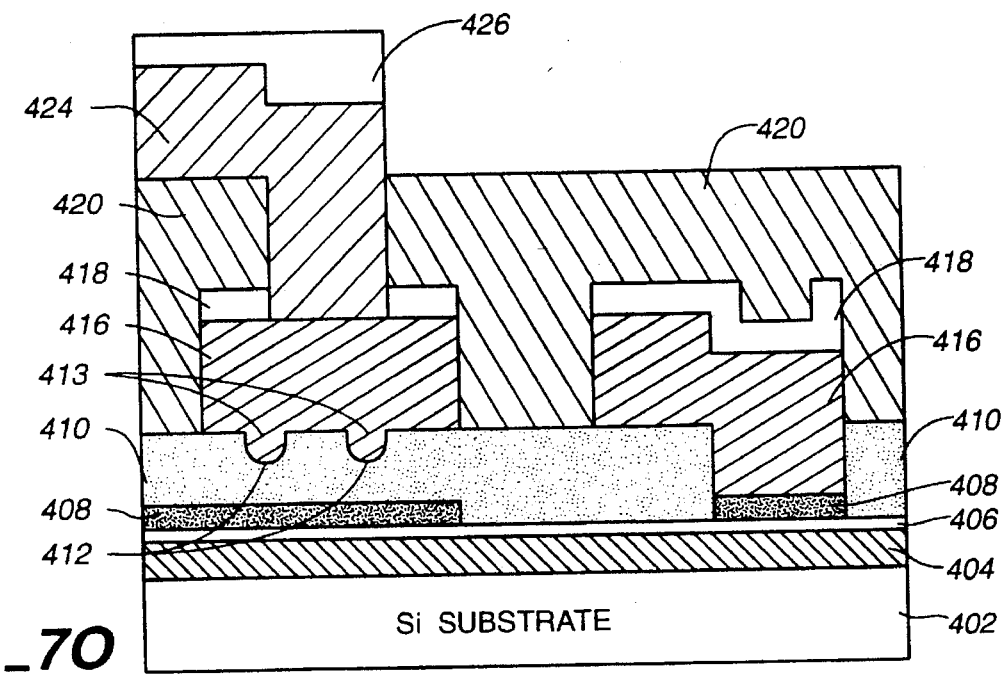
FIG._7O
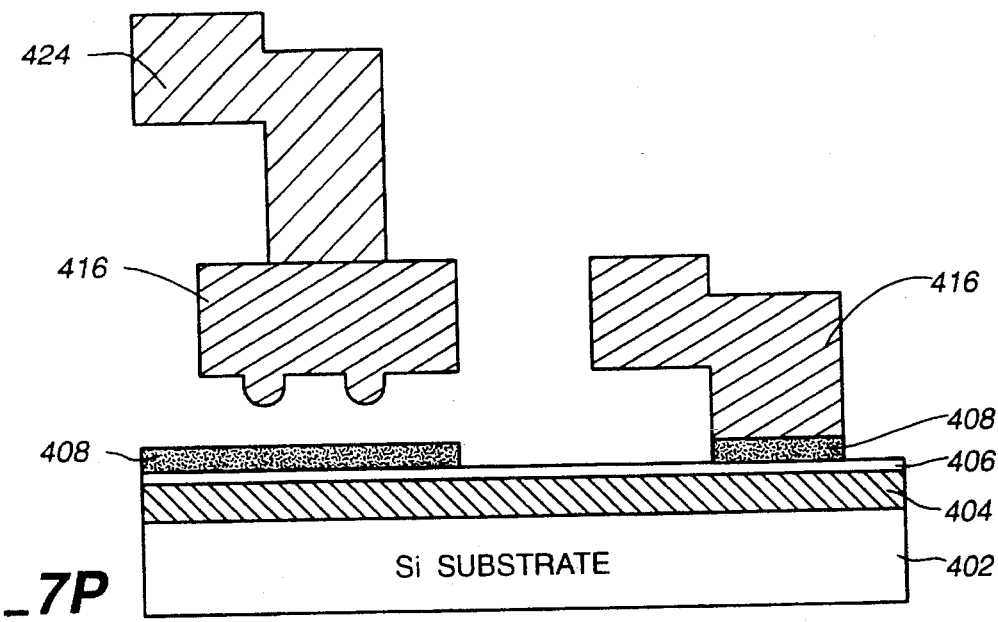
FIG._7P

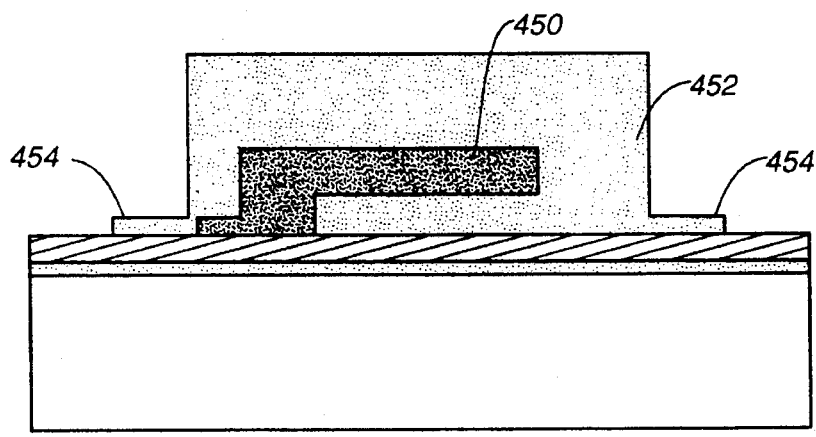
FIG._7Q
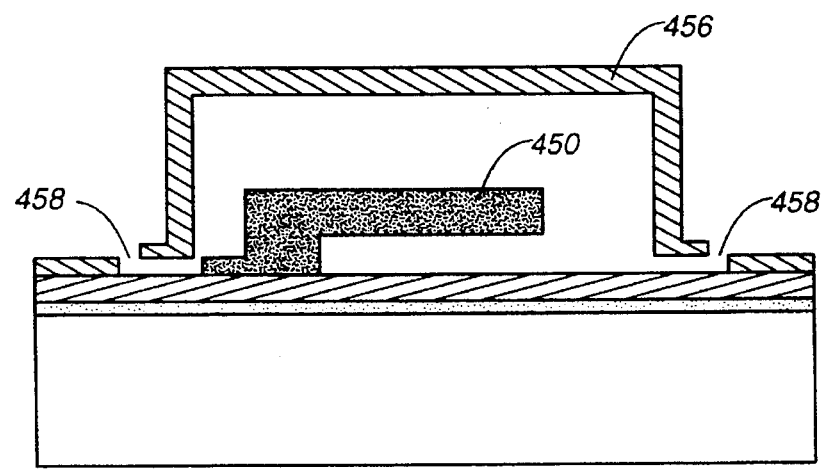
FIG._7R
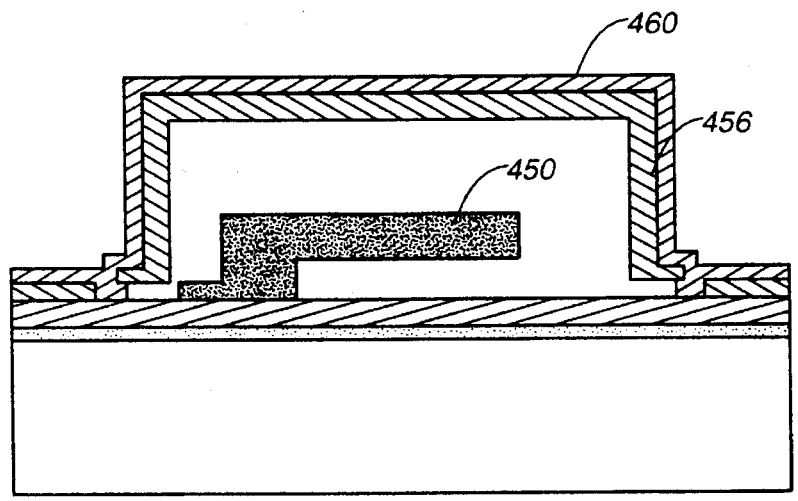
FIG._7S

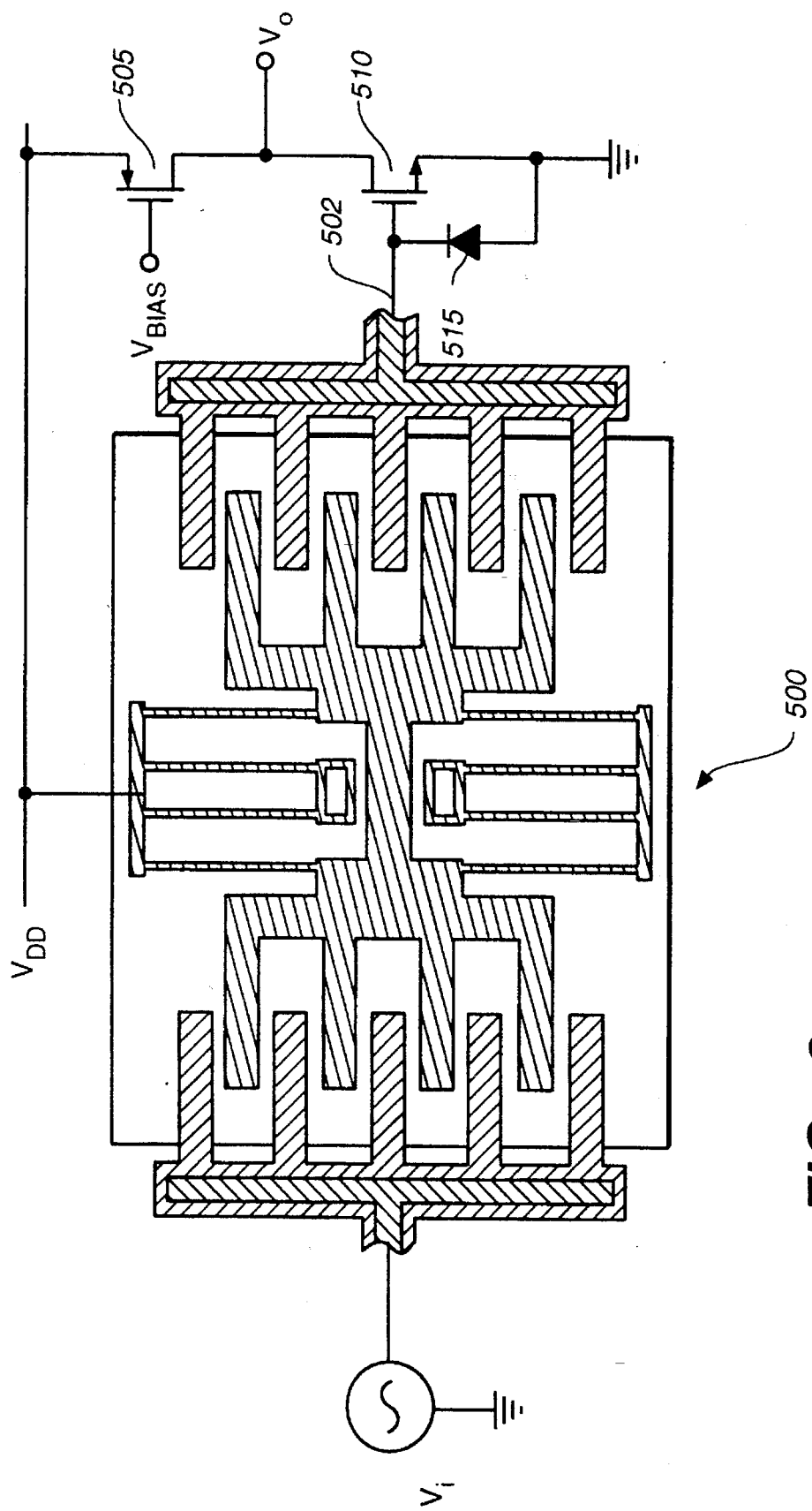
FIG._8

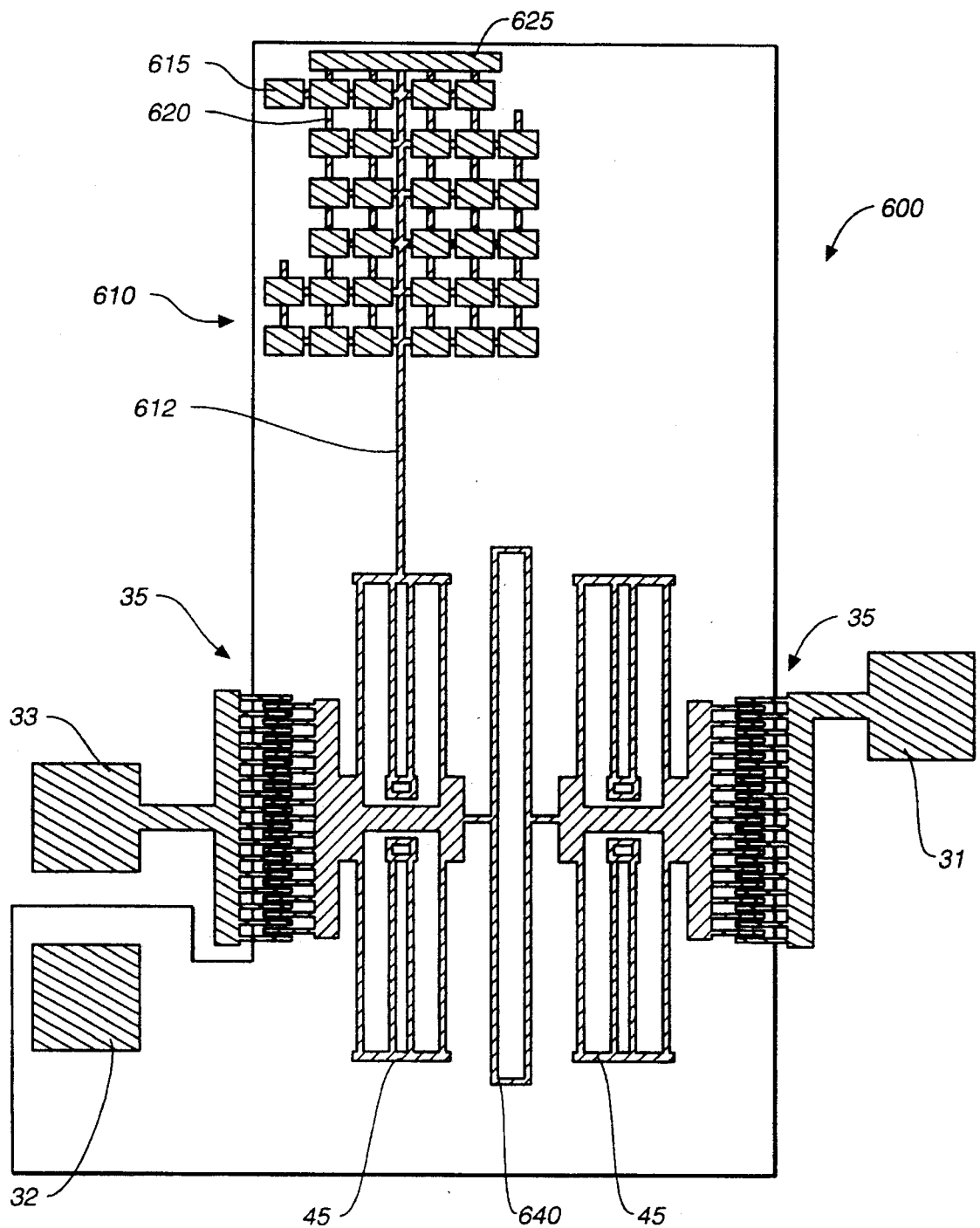
FIG._9

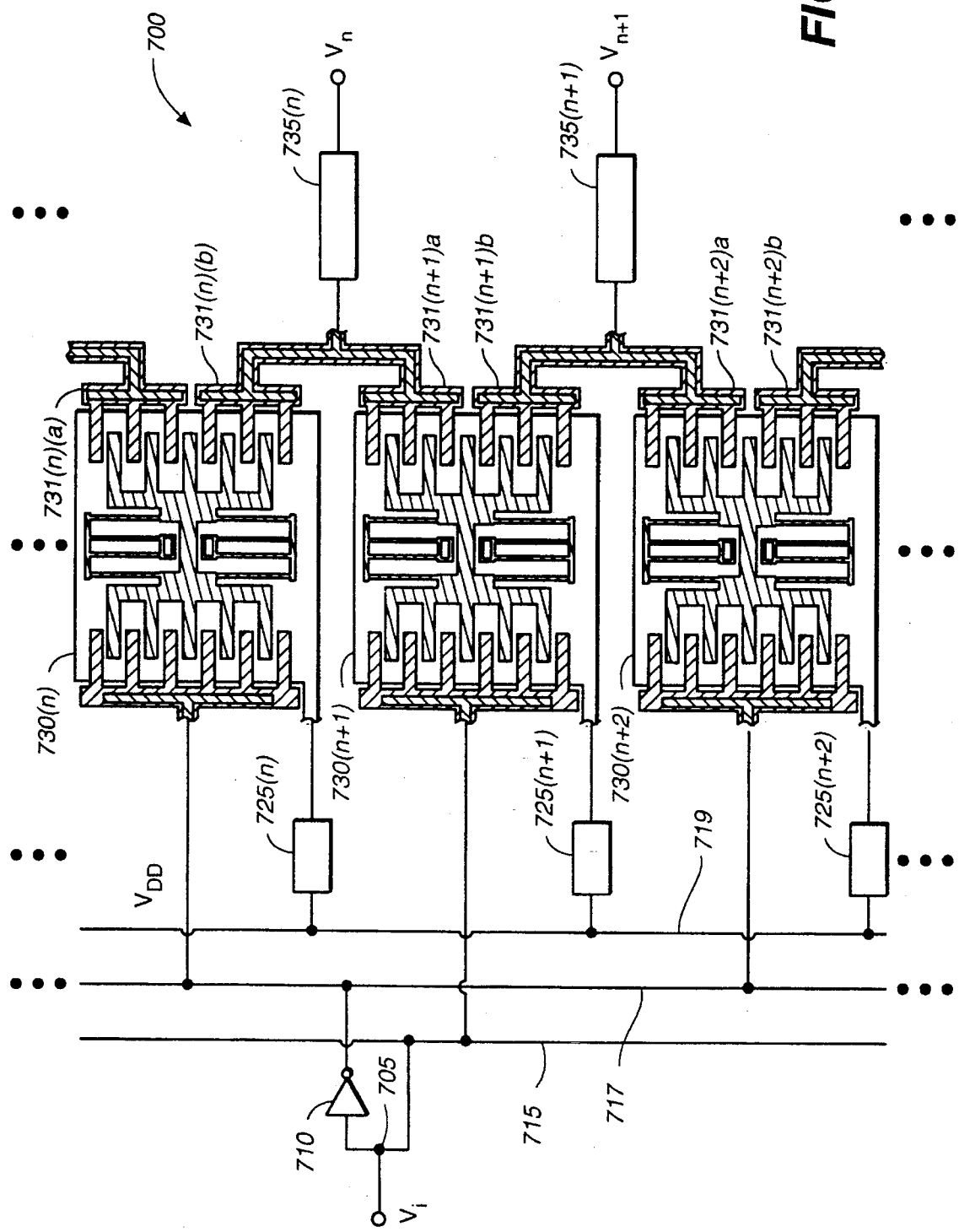
FIG._10

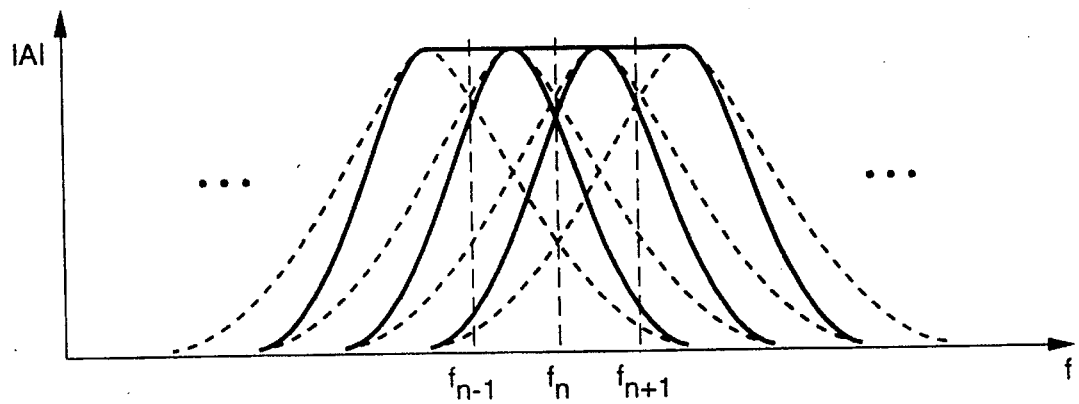
FIG._11
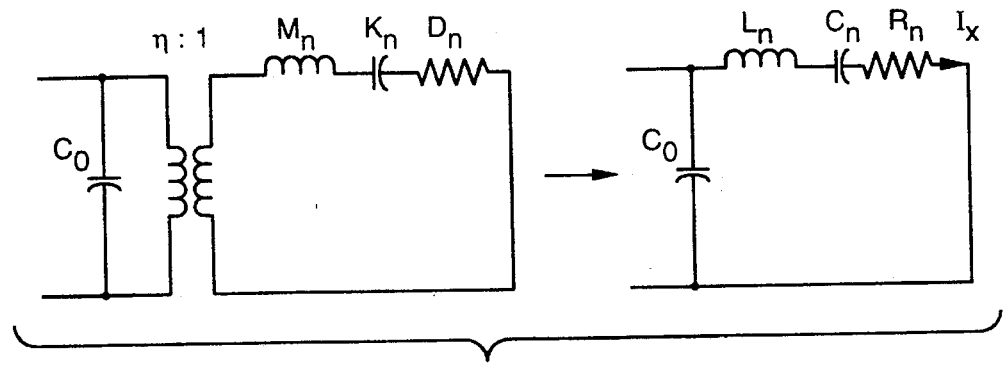
FIG._12A
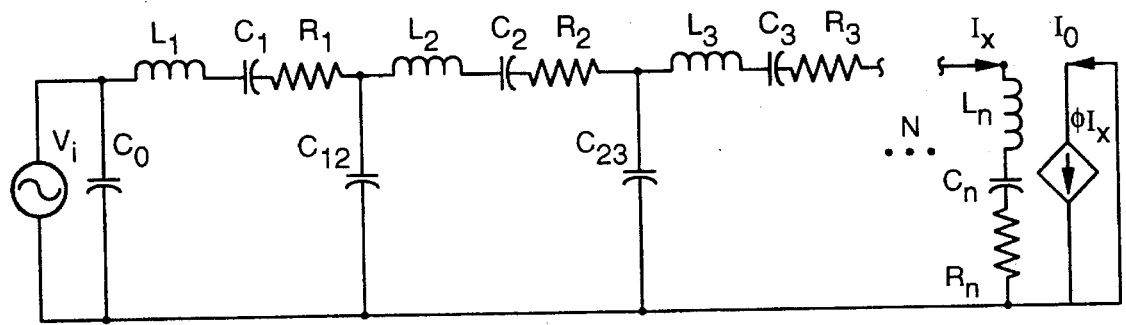
FIG._12B
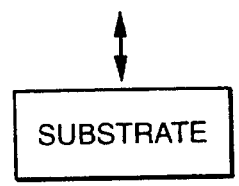
FIG._13A
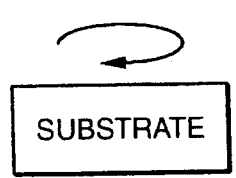
FIG._13B
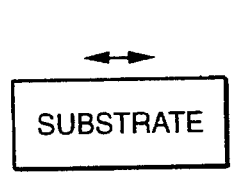
FIG._13C

MICROELECTROMECHANICAL SIGNAL PROCESSOR FABRICATION

This application is a division of application Ser. No. 08/298,233, filed Aug. 30, 1994, now U.S. Pat. No. 5,537,083; which is a continuation of application Ser. No. 07/990,582, filed Dec. 11, 1992, now abandoned.

BACKGROUND OF THE INVENTION

The present invention relates generally to microfabricated signal processors, and more particularly to microfabricated signal processors which include microelectromechanical components.

The use of electromechanical filters for signal processing dates back to the second World War. An example of such early work is Robert Adler's filter (see Compact Electromechanical Filters, Electronics, 20, pp. 100–105, April 1947) which used steel plates connected by short wires to transmit vibrations and act as a high frequency filter in broadcast receivers. Mechanical filters were refined between 1950 to 1970 into effective signal processing components and were applied to a variety of systems, such as telephone channel filters.

Mechanical filters are useful in systems that demand narrow bandwidth, low loss, and good stability. Mechanical filters have excellent aging characteristics. In conventional filters, nickel-iron alloys, which are capable of quality factors from 10,000 to 25,000, are used. Piezoelectric crystals, such as are commonly used in oscillators, are also sometimes used in mechanical filters.

Mechanical filters have been displaced in audio applications with the advent of integrated switched-capacitor filters, which can be implemented with complementary metal oxide silicon (CMOS) circuitry. The decline in popularity of mechanical filters is due to their high manufacturing cost and large size. They are usually several centimeters long and about one centimeter in diameter. Furthermore, very large scale integrated circuit (VLSI) technology or modular integration of CMOS with microstructure (MICS) (see W. Yun, R. T. Howe, and P. R. Gray, "Surface micromachined, digitally force-balanced accelerometer with integrated CMOS detection circuitry", Technical Digest, IEEE Solid-State Sensor and Actuator Workshop, Hilton Head Island, S.C. pp. 126–131, June 1992) makes it possible to integrate the switched-capacitor filter with other functional blocks, e.g. in a one-chip modem. Standard VLSI circuitry techniques and techniques such as flip-chip multichip modulation may be used to provide what will be termed herein as "on-board" electrical circuitry.

Standard mechanical filters utilize magnetostrictive transduction between electrical and mechanical energy. Furthermore, standard mechanical filters utilize helical springs with compression applied along the longitudinal axis, or torsional springs. Fabrication of such features is problematic using VLSI microfabrication techniques since these components are nonplanar whereas these techniques produce essentially planar structures.

One of the first micromechanical filters was the resonant gate transistor developed by Westinghouse Research and Development in 1967. The resonant gate transistor is a field-effect transistor with a vibrating metal beam replacing the gate. The beam is resonated vertical to the substrate using electrostatic forces applied by an underlying electrode, and the movement of the beam controls the capacitance and therefore the charge density and conductivity of the channel (see H. C. Nathanson, W. E. Newell, R. A. Wickstrom and J. R. Davis, "The Resonant Gate Transistor", IEEE Transactions on Electron Devices, ED-14, pp. 117–133, March 1967). Typical metal thin-film beams were 0.1 mm long and 5–10 μm thick, and a typical quality factor is 500 at 5 Khz. Development of the resonant gate transistor was abandoned due to low quality factors, high temperature coefficients of the resonant frequency, poor aging characteristics of the metal films, and severe amplitude constraints on the input signal due to the use of a nonlinear electrostatic drive (see W. C. Tang, T.-C. H. Nguyen, and R. T. Howe, "Laterally Driven Polysilicon Resonator Microstructures", Sensors and Actuators, 20, pp. 25–32, 1989).

In the present invention microresonators are fabricated from polycrystalline silicon, and driven by capacitively-coupled interdigitated electrodes. The interdigitated electrodes provide a planar structure with a linear response. Polycrystalline silicon is an attractive material for manufacturing since it is easy to fabricate and provides a low-loss material. The microresonators include folded flexures which are also essentially planar and provide a large displacement with a linear spring constant. Displacement of the electrodes produces bending, rather than torsion or compression, of the elements of the flexures. The micromechanical filters may be integrated with on-board microelectronic circuitry to provide an efficient system for signal processing.

The micromechanical filters of the present invention may be implemented as series resonators with mechanical coupling, as parallel resonators with electrically summed responses, or as combinations thereof. Both approaches achieve high signal-to-noise ratios and quality factors on the order of 50,000 in vacuum. The resonant frequency of the micromechanical structure may be controlled by a trimming process after fabrication of the structural components (see T. M. Bloomstein and D. J. Ehrlich, "Laser Deposition and Etching of Three Dimensional Microstructures," Transducers '91, pp. 507–511, San Francisco, June 1991, or G. K. Fedder and R. T. Howe, "Thermal Assembly of Polysilicon Microstructures", IEEE Micro Electro Mechanical Systems Conference, Nara, Japan, pp. 51–57, January 1991). Micromechanical filters are particularly well suited for devices requiring very high quality factor circuits, such as real-time spectrum analyzers.

As shown in FIG. 1a, a micromechanical system 230 may be fabricated on a silicon wafer 240. Microresonators 232 may be coupled to on-board circuitry 234, and the micromechanical system 230 may be hermetically sealed by a shell 238. The micromechanical system 230 may be incorporated into a larger microfabricated system 250 as shown in FIG. 1b, the larger system 250 including electronic circuitry 252, 254 and 256, and interfaced to other electronic components by a plurality of leads 260.

As a single-chip component or as part of an integrated microsystem, microelectromechanical filters have potential application as IF (intermediate frequency) filters in radios and as channel filters, signaling filters, and pilot tone filters in FDM (frequency-division multiplexed) telephone systems and FSK (frequency-shift keying) modems. The ability to fabricate numerous filters of the present invention on a single chip makes these filters particularly well-suited for real-time spectrum analyzers.

An object of the present invention is to provide a microelectromechanical signal processor.

Another object of the present invention is to provide a microelectromechanical signal processor which is essentially planar and may be fabricated with VLSI fabrication techniques in a small number of processing layers.

3

Another object of the present invention is to provide microelectromechanical signal processors which have high signal-to-noise ratios and quality factors.

Another object of the present invention is to provide a microelectromechanical signal processor which includes many individual resonators and hence may function as a multi-channel signal processor.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the claims.

SUMMARY OF THE INVENTION

The present invention is directed to a micromechanical resonator having an input lead, and input and output transduction electrodes, each transduction electrode having a stationary comb and a moving comb, the fingers of the moving and stationary combs being interdigitated, and a substantially planar mechanical structure coupling the moving comb of the input electrode to the moving comb of the output electrode The process of the present invention includes depositing electrical signal processing circuitry on a substrate, depositing interface components between the signal processing circuitry and a mechanical filter in a first layer, the interface components including a stationary input electrode and a stationary output electrode, and depositing in a second layer components of the mechanical filter which are anchored to but free to move above the substrate, including at least one lateral spring, a moving input electrode capacitively coupled to the stationary input electrode, and a moving output electrode capacitively coupled to the stationary output electrode.

BRIEF DESCRIPTION OF THE DRAWINGS

The accompanying drawings, which are incorporated in and constitute a part of the specification, schematically illustrate a preferred embodiment of the invention and, together with the general description given above and the detailed description of the preferred embodiment given below, serve to explain the principles of the invention.

FIG. 1a shows a cross-section of a hermetically sealed micromechanical resonator on a wafer which includes electronic circuitry, and FIG. 1b shows the system of figure 1a on a chip which includes other circuitry.

FIG. 2a illustrates a simple mechanical system which consists of two resonators coupled in series, and FIG. 2b illustrates an extended sequence of resonators coupled in series.

FIGS. 3a–d illustrates how the output of two resonators in parallel may be combined to produce a bandpass filter or a notch filter, depending on the relative phase of the outputs.

FIG. 4 shows a microelectromechanical resonator which is the electrical analog of the mechanical system of FIG. 2.

FIG. 5 shows a microelectromechanical resonator which includes four coupled resonators in series and a bridging spring between the first and last resonators.

FIGS. 6a and 6b show circuits which include two microelectromechanical resonators in parallel, the analog inverter in FIG. 6a introducing a phase shift which produces a bandpass filter, while the lack of an inverter in FIG. 6b produces a notch filter.

FIGS. 7a–s show cross-sections of a device of the present invention during successive stages of the fabrication process.

FIG. 8 shows on-board circuitry for amplification of the mechanical resonator signal.

FIG. 9 shows a tunable notch filter which has a tunable resonator attached to a suspension flexure.

FIG. 10 schematically illustrates a portion of a real-time spectrum analyzer.

FIG. 11 shows the response curves of the outputs of the real-time spectrum analyzer of FIG. 10.

FIG. 12a provides a graphical representation of the parameter $\eta$, and FIG. 12b provides a graphical representation of the parameter $\Phi_i$. FIG. 13 schematically illustrates possible vibrational modes of micromechanical resonators.

DETAILED DESCRIPTION OF THE PREFERRED EMBODIMENTS

The present invention will be described in terms of the preferred embodiment. The preferred embodiment is a microelectomechanical apparatus for signal processing and a method for fabrication of such devices.

The concept of a mechanical filter is illustrated in FIG. 2a, which shows two resonators coupled by a spring. Masses $M_1$ and $M_2$ linked to immovable walls by springs $K_1$ and $K_2$, respectively, and linked together by a third spring $K_{12}$. The motion of the masses $M_1$ and $M_2$ is damped by damping pots $C_1$ and $C_2$. FIG. 2b shows an extended sequence of resonators coupled by springs. Mass $M_n$ is linked to an immovable wall by spring $K_n$ and linked to mass $M_{n+1}$ by spring $K_{n,n+1}$. The motion of mass $M_n$ is damped by damping pots $C_n$. Force F on the end mass $M_1$ produces a displacement $x_n$ of mass $M_n$, An analogous micromechanical filter of the present invention is shown schematically in FIG. 4. The filter 30 consists of left and right interdigitated comb electrodes 35, a coupling spring 40, and two suspension flexures 45. These mechanical components are constructed of polysilicon and typically have a thickness on the order of 2 microns. The interdigitated electrodes 35 have a stationary outside comb 37 which is electrically connected to on-board electrical circuitry by way of lead 34 and contact pad 33, and anchored to a substrate 32, and a moving comb 36 which is mechanically coupled to the suspension flexures 45 and the coupling spring 40. Each stationary comb electrode 37 has a spine portion 37s and a plurality of fingers extending from the spine 37s. Similarly, each moving comb electrode 36 has a spine portion 36s and a plurality of fingers protruding from the spine 36s. Mass $M_1$ of FIG. 2 is analogous to the mass of the left moving electrode component 36 and adjacent weight block 55, and similarly for mass $M_2$. The interdigitated electrodes 35 preferably have a few to dozens of fingers, and more preferably have approximately 15 fingers, and the fingers may have lengths and widths between 10 microns and 500 to 1000 microns. For the lateral motions required of the component of the filter 30 it is preferable that the widths of the components is greater than the thickness.

Each suspension flexure 45 is anchored to the substrate 32 by a pair of anchors 50 at the interior ends of inner arms 48. The suspension flexures 45 are attached to the weights 55 and the moving portion 36 of the electrodes 36 at the interior ends of outer arms 47. The inner and outer arms 48 and 47 are connected at their outer ends by crossbars 49. The suspension flexures 45 perform functions analogous to the springs $K_1$ and $K_2$ and friction between the weights 55 and the substrate 32 is analogous to the damping provided by pots $C_1$ and $C_2$ of FIG. 2. The coupling spring 40 has a cross beam 41 at each end, and side beams 42 extending between the cross beams 41, and performs a function analogous to the coupling spring $K_{12}$ of FIG. 2. Typically, each cross beam 41 has a length of 20 microns, and a width of approximately 5 microns, and each-side beam 42 has a length of 200–500 microns and a width of 1–2 microns. The coupling spring 40 of FIG. 4 is not shown to scale relative to the suspension flexures 45; rather, its width is exaggerated to highlight its essential role in synthesizing the filter response. Except for the anchors 50, all components of the resonant system 30 of FIG. 4 between the two moving combs 36 are fabricated from the same polysilicon layer. It has been found that this two-resonator filter 30 has a bandwidth of about 1.2 kHz in air at atmospheric Pressure with a center frequency of 18.7 kHz. The signal-to-noise ratio and high loss is improved by using an on-board sensing amplifier.

The electrodes 35 act as electrical-mechanical transducers. By application of an alternating voltage between the stationary comb 37 of the left electrode 35 via lead 34, and a ground plane (not shown) which lies below the plane of the structure 30 shown in FIG. 4, the moving comb 36 of the left electrode 35 reciprocates from left to right. This motion induces a reciprocating motion from left to right of the left weight 55, and induces arms 47 and 48 of the flexure suspension 45 to bend in the plane of the figure, and the crossbars 49 to reciprocate from left to right. The reciprocating motion of the weight 55 induces bending in the side beams 42 of the spring 40 and the end beams 41 reciprocate from left to right. The motion of the spring 40 induces a motion in the right flexure suspension 45, weight 55, and electrode 35, similar to those of the left flexure suspension 45, weight 55, and electrode 35. Because the flexure suspensions 45, and the spring 40 lie substantially in a plane, and the motion of these components also in substantially confined to a plane, they will be referred to as lateral springs. U.S. Pat. No. 5,025,346, issued Jun. 18, 1991, which describes lateral microstructures is incorporated herein by reference. Additionally, the paper entitled Micro Electromechanical Filters for Paper entitled Micro Electromechanical Filters for Signal Processing, presented at the IEEE Micro Electrical Mechanical Systems Workshop, Travemunde, Germany, Feb. 4 through 7, 1992, which describes the theory underlying lateral microstructures and presents experimental results is also incorporated herein by reference.

For a flat, symmetrical bandpass response, the resonators should be designed with identical 3 decibel bandwidths and resonance amplitudes. The frequency separation, $f_2-f_1$, which is needed in order to achieve a maximally flat passband response can be found by equating the output current of the coupled resonators at the center frequency with the peak current of each individual resonator at their resonant frequencies. From such an analysis, the required frequency separation $\Delta f$ is found to equal the 3 decibel bandwidth of the individual resonators constituting the filter, i.e.

$$\Delta f = \frac{f_1}{Q_1} \quad (1)$$

where $f_1$ is the resonance frequency of the lower resonator. The filter rolloff outside the passband specifies the quality factor required of the individual resonators. The combination of a steep rolloff and a relatively broad passband, $f_u-f_l$, therefore demands a large number, N, of resonators in parallel, i.e., $$N = \frac{f_u - f_l}{\Delta f} = Q_1 \frac{f_u - f_l}{f_l} . \quad (2)$$

A general N-resonator series filter, as shown in FIG. 2b, with nearest-neighbor coupling springs can be mechanically modeled. The transfer function of the output displacement $X_n$ of the $n^{th}$ mass $M_n$ to the input force, F, is of the form $$\frac{X_n}{F} = \frac{1}{C_{2n}S^{2n} + C_{2n-1}S^{2n-1} + C_{2n-2}S^{2n-2} + \ldots + C_0} , \quad (3)$$

and the derivative of the output displacement is proportional to the sense current.

The equivalent mass $M_i$, the spring constant $K_i$, and the damping coefficient $D_i$ for an individual resonator is given by:

$$M_i = M_{ip} + 0.3714 M_{ib} \quad (4)$$

$$K_i = 2Eh \left( \frac{W_i}{L_i} \right)^3 \quad (5)$$

$$D_i = \frac{(M_i K_i)^{1/2}}{Q_i} , \quad (6)$$

where $M_{ip}$ and $M_{ib}$ represent the mass of the weight 55 and the mass of the folded beams 47 and 48 of the i-th suspension flexure, respectively, and $W_i$ and $L_i$ are the width and length of the beams. The thickness of the microstructure is h and the Young's modulus is E. The damping coefficient is determined experimentally from the measured quality factor, $Q_i$, although a reasonable model based on viscous drag may be used. Quality factors range from less than 100 at atmospheric pressure in air to approximately 50,000 in high vacuum.

The inter-resonator coupling spring rates are given by:

$$K_{ij} = Eh \left( \frac{W_{ij}}{L_{ij}} \right)^3 , \quad (7)$$

in which $W_{ij\ and\ Lij}$ are the width and length of the beams of square truss coupling springs 150, 151, and 152, as shown in FIG. 5 and discussed in more detail below.

From an electronic system design standpoint, the transfer function relating input voltage to output current $I_o/V_i$ is most useful. Such a relation may be obtained by relating the internal mechanical parameters, F and $X_n$, to the corresponding electrical input and output through the phasor relations:

$$F = V_{Pi} \left( \frac{\partial C}{\partial x} \right)_i V_i \quad (8)$$

$$I_o = V_{Po} \left( \frac{\partial C}{\partial x} \right)_o j\omega X_n \quad (9)$$

where $V_{pi}$ and $V_{po}$ represent the dc bias at the drive (input) and sense (output) ports, respectively, $V_i$ is the amplitude of the ac driving voltage, and $(\partial C/\partial x)_i$ and $(\partial C/\partial x)_o$ are the capacitive changes with respect to comb motion at the respective ports. For the particular case of comb driven transducers of the present invention, the value $\partial C/\partial x$ is a constant and can be theoretically approximated as:

$$\frac{\partial C}{\partial x} = \frac{2N\epsilon_0 h}{d} \quad (10)$$

where N is the number of the comb fingers, $\epsilon_0$ is the permittivity, and d is the gap between the fingers. This, however, is an underestimate since the effect of fringing fields is neglected. Hence, the filter transconductance can be expressed in phasor form as:

$$\frac{I_o}{V_i} = \frac{j\omega V_{Pi} V_{Po} \left(\frac{\partial C}{\partial x}\right)_i \left(\frac{\partial C}{\partial x}\right)_o}{C_{2n}(j\omega)^{2n} + C_{2N-1}(J\omega)^{2n-1} + C_{2n-2}(j\omega)^{2n-2} + \ldots + C_0} \quad (11)$$

Most previous analyses for filters in the macro scale transform the mechanical elements into the equivalent electrical elements in order to apply the large body of electrical filter design tools. The theoretical transformation parameter, $\eta$, represented graphically in FIG. 12a, can be theoretically obtained by first deriving the equivalent RLC circuit elements for a single comb-driven resonator, then generalizing the resulting $\eta$ for the case of a complete filter. From the above, one finds $$\eta = \frac{1}{V_{Pi}\left(\frac{\partial C}{\partial x}\right)_i} \quad (12)$$

Table I below lists of the indirect analogy between electrical and mechanical systems. Note the force and velocity in a mechanical system are equivalent to voltage and current in an electrical system. Hence, the electrical equivalent circuit for the series resonator filter of FIG. 2b can be mapped to the purely electrical filter of FIG. 12b where $C_0$ is the d.c. capacitance of the comb fingers. The electrical elements are related to the mechanical elements as follows:

$$L_i = M_i \eta^2, \quad (13)$$

$$C_i = \frac{1}{K_i \eta^2}, \quad (14)$$

$$R_i = D_i \eta^2, \quad (15)$$

and $$C_{ij} = \frac{1}{K_{ij}} \eta^2. \quad (16)$$

The amplification factor, $\Phi_i$, represented graphically in FIG. 12b, can be expressed as $$\phi_i = \frac{|I_o|}{|I_x|} = \frac{V_{Po}\left(\frac{\partial C}{\partial x}\right)_o}{V_{Pi}\left(\frac{\partial C}{\partial x}\right)_i}, \quad (17)$$

where $I_o$ is the output current and $I_i$ is the input current. The final form of $I_o/V_i$ is exactly the same as Eq. (11).

TABLE I

| Mechanical System | Electrical System |
|---|---|
| Force (F) | Voltage (V) |
| Velocity (∂x/∂t) | Current (I) |
| Compliance (1/K) | Capacitance (C) |
| Damping (D) | Resistance (R) |
| Mass (M) | Inductance (L) |

In order to synthesize some filter characteristics, it is necessary to fabricate systems with greater numbers of springs and masses, or with springs which couple nonadjacent resonators. A plan view of the layout of a four-resonator filter 130 with two bridging springs 160 coupling the first resonator 190 and the fourth resonator 193 is shown in FIG. 5. In this filter 130 coupling springs 150, 151 and 152 mechanically couple resonators 190 to 191, 191 to 192, and 192 to 193, respectively. The masses 170, 171, 172, and 173 are mounted on suspension flexures 145, 146, 147 and 148, respectively. The filter 130 is driven by the application of an alternating voltage between drive plate 180 and ground plate 182. The drive plate 180 is electrically connected to the stationary comb of the lower interdigitated electrode 135a, and the ground plate 182 is electrically connected to a doped polysilicon layer beneath the moving comb of the lower interdigitated electrode 135a. The resulting motion of the moving comb of the upper interdigitated electrode 135b generates a varying capacitance between the moving and stationary combs, which in turn generates a varying voltage across a sensing plate 184. All components between the moving combs of the two electrodes 135a and 135b are fabricated in the same layer.

Alternatively, the bridging springs 160 of FIG. 5 may be replaced with a bridging spring which lies in a plane above the plane of the other components. This requires a more sophisticated fabrication process, as is discussed in detail below. It has been found that the sacrificial layer underneath the bridging spring must be greater than 2 microns to provide sufficient clearance at the crossovers between the bridging spring and the structures below.

An electromechanical microfilter may also be realized by the filter 200 represented schematically in FIG. 6a which comprises two microresonators 205 and 210 in parallel. A voltage signal $V_1$ is directed through an analog inverter 215 to first resonator 210, and directed directly to second microresonator 205. The analog inverter 215 produces a 180° phase shift on signal $V_1$. Ground voltages $V_{DD1}$ and $V_{DD2}$ are applied to the ground planes beneath the two resonators 210 and 205, respectively. The current outputs of the two microresonators 205 and 210 are summed and directed to the transimpedance amplification unit 220 which produces an output signal $V_0$. As shown in FIG. 3, the phases 22 and 23 of the outputs from the microresonators 205 and 210 are 180° out of phase, and if the resonant frequencies of the two microresonators 205 and 210 differ by a small amount, as shown in FIG. 3a, the output response is a bandpass filter 24 as shown in FIG. 3b. The currents are in phase and combine in the frequency interval between the resonances but cancel outside this interval since the currents are out of phase.

FIG. 6b shows an electromechanical microfilter 300 where again the two microresonators 305 and 310 are in parallel, but no analog inverter is included in the signal. A voltage signal $V_1$ is directed to a first microesonator 310 and second microresonator 305, and the current outputs of the two microresonators 305 and 310 are summed and directed to a transimpedance amplification unit 320 which produces an output signal $V_0$. Ground voltages $V_{DD1}$ and $V_{DD2}$ are applied to the ground planes beneath the two resonators 310 and 305, respectively. If the resonant frequencies of the two microresonators 305 and 310 differ by a small amount, as shown in FIG. 3c, since the signals are in-phase the output response is a notch filter 29 as shown in FIG. 3d. The currents are out of phase by about 90° and cancel in the frequency interval between the resonances but combine outside this interval since the currents are in-phase.

FIGS. 7a-p show cross-sections of the device of the present invention at successive stages of fabrication. The starting material for the fabrication process is a silicon substrate 402 as shown in FIG. 7a. The substrate 402 is oxidized as shown in FIG. 7b, preferably by a wet oxidation process due to the speed of the process, to produce an oxidation layer 404, preferably having a thickness of approximately 0.5 μm. Nitride is then deposited by low-pressure chemical vapor deposition (LPCVD) on the oxide layer 404 to produce a nitride layer 406, as shown in FIG. 7c. On the nitride layer 406, a polysilicon layer 408 doped with phosphorous is deposited by LPCVD, as shown in FIG. 7d. As shown in FIG. 7e, the in situ doped polysilicon layer 408 is then patterned by laying a first mask and performing a plasma dry etch. A layer of phosphosilicate glass (PSG) 410 is then deposited over the patterned polysilicon layer 408, as shown in FIG. 7f, and patterned by laying a second mask and performing a wet etch to produce dimples 412, as shown in FIG. 7g. Subsequently, wells 414 are made in the PSG layer 410 which extend down to portions of the polysilicon 408 by contact patterning of a third mask followed by a plasma dry etch, as shown in FIG. 7h. Then a LPCVD deposition of 2 μm thick layer of undoped polysilicon 416 is then performed. The polysilicon 416 bonds to portions of the lower polysilicon layer 408 exposed by the wells 414, and fills the dimples 412 to provide knobs 413 on the bottom surface of the polysilicon layer 416, as shown in FIG. 7i. A second PSG deposition by LPCVD is then performed to provide a PSG layer 418, as shown in FIG. 7j, on the polysilicon layer 416. The phosphorous of the PSG layer 418 is driven into the polysilicon 416 by heating to dope the layer 416. Doping the polysilicon 416 subsequent to deposition is quicker than direct deposition of doped polysilicon. Doping of the polysilicon is necessary to increase the conductance. Placement of a fourth mask followed by a plasma dry etch then patterns the polysilicon 416 and PSG layer 418, as shown in FIG. 7k.

A final etch and rinse then removes the PSG layers 410 and 418 (not shown), to provide a singlelayer microelectronic resonator. Sections of the upper polysilicon layer 416 which are bonded to the lower polysilicon layer 408 are not movable. For instance, such immovable components include the anchors 50 and the stationary combs 37 of the interdigitated electrodes 35 of the filter 30 of FIG. 4. Sections of the upper polysilicon layer 416 which are not bonded to the lower polysilicon layer 408 are movable. Such movable sections are provided with knobs 413 to reduce the area of contact of the polysilicon layer 416 with the surface below, thereby preventing sticking between the layers. Movable sections of the filter 30 of FIG. 4 include the weights 55, the flexure suspensions 45, the spring 40, and the movable combs 36 of the interdigitated electrodes 35.

For microelectromechanical filters having more than a single layer of movable structures, such as filters having bridging springs as discussed above, the fabrication process steps continues from that shown in FIG. 7k (without the application of an etch of the PSG layers 418 and 410 as was discussed above in conjunction with a single layer structure). As shown in FIG. 7l, another 2 μm layer of PSG 420 is deposited, and this PSG layer 420 is patterned as shown in FIG. 7m to provide wells 422 to the polysilicon layer 416. Another polysilicon layer 424, and then another PSG layer 426 are deposited, as shown in FIG. 7n, and then masking and a plasma dry etch are performed to provide structures such as those shown in cross-section in FIG. 7o. Finally, the PSG layers 410, 418, 420 and 426 are removed by a final etching step to provide anchored polysilicon structures, (such as the structure shown on the right of FIG. 7p), one-layer polysilicon structures, and two-layer polysilicon structures (such as the structure shown on the left of FIG. 7p).

As shown in FIG. 8, in the preferred embodiment the on-board sensing circuitry for a microfilter 500 involves capacitive detection using a depletion mode NMOS transistor 510 and an enhancement mode PMOS transistor 505. A signal source $V_i$ drives the microfilter 500, and the output of the microresonator 500 is connected to an output lead 502. A voltage $V_{DD}$ is applied to a ground plane of the microfilter 500 and the drain of the PMOS 505. The depletion mode NMOS 510 and the enhancement mode PMOS 505 are connected so that the PMOS 505 is an active load for the NMOS 510 to provide high gain, with the amplified output $V_o$ extracted from a lead between the two transistors 505 and 510. A constant bias voltage $V_{bias}$ is applied to the gate of the NMOS 505, and the output 502 of the microfilter 500 is applied to the gate of the PMOS 510. A biasing voltage is applied to the gate of the PMOS 510 by a diode 515 connected to ground.

The method of voltage amplification shown in FIG. 8 takes full advantage of the excellent input noise performance of the MOS transistors 505 and 510. Since the equivalent output resistance of a microresonator is usually very large (on the order of 10 MΩ), only current noise is important for determination of the signal-to-noise ratio. The signal-to-noise ratio can be estimated by using typical noise characteristics of a MOS transistor and the typical output current of an interdigitated comb. For a filter with a 0.1 Hz bandwidth, a center frequency of 20 kHz, and a 10 nA output current at resonance, the signal-to-noise ratio (S/N) is calculated to be 160 decibels. For wider bandwidths, the S/N degrades with the square root of the pass band. For example, a 1 kHz bandwidth corresponds to an S/N of 120 decibels. These estimated S/N values greatly exceed the 80–90 Db typical of switched-capacitor filters.

A series notch filter 600 with an adjustable notch frequency is shown in FIG. 9. The filter 600 is essentially the filter 30 of FIG. 4 (corresponding components of the two filters are labelled with the same reference numerals) with a damping structure 610 attached to the leftmost flexure suspension 45. Other differences between FIG. 9 and FIG. 4 include a source pad 33, a ground pad 32 connected to a ground plane (not shown), and a sensor pad 31. The coupling spring 640 differs slightly from the coupling spring 40 of FIG. 4. The damping structure 610 has a connecting rod 612 which connects to an anchor 625. Located in a rectangular array are a multiplicity of trim weights 615. The trim weights 615 are connected to nearest neighbor trim weights 615 by microbridges 620, with the exceptions that trim weights 615 adjacent the connecting rod 612 are connected by a microbridge 620 to the connecting rod 612, and the trim weights 615 adjacent the anchor 625 are connected by a microbridge 620 to the anchor 625. The damping structure 610 acts as a vibration absorber, and at its resonant frequency it attenuates the signal transmitted from the source pad 33 to the sensor pad 31. Therefore this filter 600 is a notch filter. The frequency characteristics of the filter 600 may be altered by severing microbridges 620 attached to the trim weights 615. This can be accomplished by resistive heating or by a focussed laser. Note that by removing one of the microbridges 620 both the mass and the spring constant change. More conventional mechanical resonator trimming techniques could also be applied, such as laser-induced evaporation of regions on a resonator.

In order to achieve high quality factors, micromechanical filters must be packaged in a moderate to high vacuum (see R. S. Payne and D. A. Dinsmore, "Surface micromachined accelerometer: a technology update," Proceedings, SAE symposium, pp. 127–135, Detroit, Mich., Febuary 1991). A vacuum ambient could be provided by a hermetic package, although this approach involves greater cost. In the preferred embodiment the entire filter is fabricated inside a thin-film vacuum cavity provided by a low-stress silicon nitride shell. The planar hermetic sealing process enables high quality factors for lateral microresonators, independent of the nature of the ambient environment. This feature only requires a few additional depositions and masking steps.

Several processes for vacuum-sealing narrow microbridges have been demonstrated previously, using epitaxial silicon, polysilicon, and silicon-rich silicon nitride as microshell materials. However, the large area of lateral resonators (up to 500×500 µm$^2$) creates problems of sacrificial layer removal, collapse of the shell under ambient pressure, and stiction between the suspended microstructure and the shell or the substrate, due to surface tension forces during the drying process after the release etch.

The vacuum sealing process involves bypassing the etching step of FIG. 7p and depositing approximately 7 microns of additional PSG deposited to cover the resonator. The vacuum shell is defined by a pattern step, an additional 1 micron of PSG or low-temperature oxide (LTO, undoped LPCVD SiO$_2$) is deposited and then patterned to provide etch channels 454 as shown in FIG. 7q. A 1 µm-thick LPCVD low-stress nitride 456 is then deposited, etch holes 458 are patterned in the nitride 456, and then all PSG inside the shell is etched away in concentrated hydrofluoric acid to provide the configuration of FIG. 7r. After rinsing in water and methanol, the wafer is dried using a supercritical CO$_2$ process. The supercritical CO$_2$ process has the advantage of producing a yield of over 90% free-standing resonators, in contrast to a yield of about 5% for wet chemical rinse/dry processes. Finally, a 2 µm-thick LPCVD nitride layer 460 is deposited at a pressure of 300 mTorr. The nitride coats all surfaces and since the channels 458 have relatively narrow apertures they are sealed as is shown in FIG. 7s. An unencapsulated, two-sided 150×2×2 µm$^2$ lateral resonator has a resonant frequency of 17 kHz, whereas the resonant frequency of encapsulated resonators on the same chip are measured at 24 kHz, indicating that there may be significant deposition of nitride on the micromechanical components during the sealing process.

Shell deflections under ambient pressure have been measured to be up to 4 µm in the center of circular shells. Deflection measurements are consistent with plate theory, assuming a low residual pressure inside the shell and small effects from the stylus force.

The majority of existing analog spectrum analyzers make use of a tunable filter, which is swept along the frequency span of interest to yield the Fourier spectrum of the input signal. The sweep time required is a function of the resolution bandwidth of the tunable filter, which in turn determines the accuracy and noise performance of the spectrum analyzer. The smaller the resolution bandwidth, the better the performance of the spectrum analyzer. However, as the resolution bandwidth decreases the necessary sweep time increases resulting in prohibitively lengthy processing times.

To reduce the sweep time, the frequency range of interest may be subdivided and parallel filters may work simultaneously on each subrange. However, without integrated micromechanical filters this approach is impractical since a single high performance filter (with low noise, good stability, and a high quality factor) is relatively large and expensive. FIG. 10 illustrates an implementation of a portion of a real-time spectrum analyzer 700 using parallel bandpass microresonator filters 730 (n), 730 (n+1), 730 (n+2), etc. (to be referred to collectively with the reference numeral 730). The input signal $V_i$ is split at a node 705, and sent to an inverter 710 and directly to a bus 715. The inverted signal is sent to a second bus 717. The ground plane of each microresonator 730(n) is connected to a voltage regulator 725 (n) via a ground bus 719.

Each microresonator 730 of the real-time spectrum analyzer is adjacent two others: one with a higher resonance frequency and the other with a lower resonant frequency. Each microfilter 730(n) has two stationary output comb electrodes 731(n)(a) and 731(n)(b), and adjacent electrodes 731(n)(a) and 731(n)(b) from neighboring filters 730 are directed via a transimpedance amplifier 735(n) to an output $V_n$. Thus, each microresonator 730(n) contributes to two bandpass filters: one filter has a center frequency higher than the microresonator resonance frequency, and one filter has a center frequency lower than the microresonator resonance frequency.

The use of parallel microresonator bandpass filters offers the advantage of "self-alignment" of bandpass filters. Self-alignment refers to the automatic edge overlapping of adjacent filters as shown in FIG. 11, which comes about due to the interlinked nature of the parallel microresonator scheme. For instance, the left shoulder of the band centered at frequency $f_n$ is at approximately the same frequency as the right shoulder of the band centered at frequency $f_{n-1}$. Self-alignment is especially useful given the tolerances associated with microfabrication. The deviation of resonance frequencies from the mean over a wafer can be as high as 3%. Since adjacent resonators deviate together from the mean, self-alignment insures adequate performance.

A real-time spectrum analyzer may be difficult to realize in practice if the desired resolution bandwidth is on the order of 0.1 Hz, since the final product will require too many filters for a practical frequency span. In this case, a spectrum analyzer with many 0.1 Hz bandwidth microfilters, each swept over small adjacent frequency ranges, might prove more practical. Such a scheme would require electrically tunable resonant frequencies. Comb-finger designs which have a nonlinear variation of comb capacitance with displacement allows control of the resonant frequency. The speed advantage of the parallel implementation increases as the number of microfilters increases, or as the frequency range which each microfilter must sweep decreases.

In summary, an apparatus and method for a micromechanical filter has been described. The present invention has been described in terms of a preferred embodiment. The invention, however, is not limited to the embodiment depicted and described. Many variations are possible. For instance, other fabrication process sequences and materials are possible and may have advantages for particular applications. For example, single-crystal silicon lateral resonant microstructures may be fabricated by means of a wafer-bonding process (see Y. B. Gianchandani and K. Najafi, "A bulk silicon dissolved wafer process for microelectromechanical devices", *Journal of Microelectromechanical Systems*, Vol. 1, pp. 77–85, June 1992) a silicon fusion bonding process (see K. Peterson, F. Pourahmadi, and J. Brown, "Resonant beam pressure sensor fabricated with silicon fusion bonding," in Proceedings of the International Conference on Solid-State Sensors and Actuators (Transducers '91), San Francisco, pp. 664–667, June 1991), a LIGA process (see C. Burbaum, J. Mohr, P. Bley, and W. Ehrfeld, "Fabrication of capacitive acceleration sensors by the LIGA technique", Sensors and Actuators A-Physical, V27 N1–3:559–563, May 1991), or hollow beam process (see M. W. Judy and R. T. Howe, "Polysilicon hollow beam lateral resonators," to appear in IEEE Micro Electro Mechanical Systems workshops, Ft. Lauderdale, Fla., February 1993). However, a major advantage of the polysilicon structures of the present invention is that they can, in principle, be fabricated along with highly integrated CMOS microelectronic functional blocks.

In an alternate embodiment micromechanical stops are included to protect the interdigitated fingers of the comb electrodes from collision with the spine of the opposing electrode due to excessive input levels. Impact of the movable comb with the stops is unlikely to break the suspension since the suspension is generally more sturdy than the fingers. Dimples may be provided on the stops to prevent the electrode from sticking to the stops.

In another alternate embodiment on-board automatic gain control circuitry, such as is well-known in the art, is provided at the input to protect the filter. When the input voltage is out-of-range it is attenuated, input to the mechanical filter, and then reamplified at the output.

Many other types of microresonators are also possible within the spirit of the invention. For example, vertical mode microresonators (the motion relative no the substrate being illustrated in FIG. 13a, see R. T. Howe, "Integrated Silicon Electromechanical Vapor Sensor," Ph.D. thesis, University of California at Berkeley, Department of Electrical Engineering and Computer Science, December 1984), torsional mode microresonators (the motion relative to the substrate being illustrated in FIG. 13b, see W. C. Tang, T.-C. H. Nguyen, and R. T. Howe, "Laterally Driven Polysilicon Resonant Microstructures," *Sensors and Actuators,* 20, pp. 25–32, 1989), other types of microresonators and or microsprings having other types of modes may be fabricated to serve the same functions as the lateral microresonators, as illustrated in FIG. 13c and described in detail above.

Many other variations are also possible within the spirit of the invention. For instance: other sensor circuitry may be used; other flexure shapes are possible; and other combinations and configurations of flexures are possible; the mechanical components of the filter may be constructed of materials other than polysilicon, such as single crystal silicon; other types of on-board amplification circuitry may be used, such as a transresistance amplifier with a feedback resistor in the op amp I–V converter; the on-board circuitry may be provided by other techniques such as flip-chip multichip modulation (MCM); bridging springs may be connected in other configurations between other pairs of resonators and multiple bridging springs may be present in a single filter; and the mechanical components of the filter may be manufactured using other techniques such as LIGA. It is therefore to be understood that the scope of the invention is defined by the appended claims.

What is claimed is:

1. A method for fabrication of a microelectromechanical signal processor on a substrate, said method comprising the steps of:

(a) fabricating a first patterned layer on said substrate;

(b) fabricating a second patterned layer having an opening for anchoring a third patterned layer;

(c) fabricating said third patterned layer;

(d) fabricating a fourth patterned layer having an opening for anchoring a fifth patterned layer;

(e) fabricating said fifth patterned layer; and (f) etching said fourth layer and said second layer.

2. The method of claim 1 wherein step (b) further includes providing dimples in said second layer.

3. The method of claim 1 wherein said first, third and fifth layers include polycrystalline silicon.

4. The method of claim 1 wherein said second and fourth layers include phosphosilicate glass.

5. The method of claim 1 further including the steps of:

(g) after step (e) and before step (f) fabricating a structure comprising a sixth patterned layer;

(h) after step (g) and before step (f) fabricating a seventh patterned layer having etch holes;

(i) after step (f) fabricating an eighth layer for sealing said etch holes in said seventh layer; and wherein said structure is etched in step (f).

6. The method of claim 5 further including the step of drying said substrate using a supercritical $CO_2$ process after step (f) and before step (i).

7. The method of claim 5 wherein said seventh and eighth layers include low-stress silicon nitride.

8. The method of claim 5 wherein step (i) is carried out at low pressure.

* * * * *